US010540925B2

United States Patent
Zhang

(10) Patent No.: US 10,540,925 B2
(45) Date of Patent: Jan. 21, 2020

(54) SHIFT REGISTER UNIT CIRCUIT, METHOD FOR DRIVING THE SAME, GATE DRIVE CIRCUIT AND DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventor: Yi Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 72 days.

(21) Appl. No.: 15/773,177

(22) PCT Filed: Sep. 27, 2017

(86) PCT No.: PCT/CN2017/103626
§ 371 (c)(1),
(2) Date: May 3, 2018

(87) PCT Pub. No.: WO2018/145472
PCT Pub. Date: Aug. 16, 2018

(65) Prior Publication Data
US 2019/0073949 A1 Mar. 7, 2019

(30) Foreign Application Priority Data

Feb. 8, 2017 (CN) .......................... 2017 1 0069661

(51) Int. Cl.
*G09G 3/3225* (2016.01)
*G11C 19/28* (2006.01)

(52) U.S. Cl.
CPC .......... *G09G 3/3225* (2013.01); *G11C 19/28* (2013.01); *G09G 2310/0286* (2013.01)

(58) Field of Classification Search
CPC ......... G09G 2310/0286; G09G 3/2092; G09G 3/3225; G09G 3/3266; G09G 3/3677; G11C 19/184; G11C 19/28
(Continued)

(56) References Cited

U.S. PATENT DOCUMENTS 7,734,003 B2   6/2010   Chien et al.
9,786,228 B2  10/2017   Ma
(Continued)

FOREIGN PATENT DOCUMENTS

CN    104318888 A    1/2015
CN    104537980 A    4/2015
(Continued)

OTHER PUBLICATIONS

Search Report for International Application No. PCT/CN2017/103626 dated Dec. 28, 2017.

*Primary Examiner* — Kwin Xie
(74) *Attorney, Agent, or Firm* — Calfee, Halter & Griswold LLP

(57) ABSTRACT

The present disclosure relates to a shift register unit circuit, a method for driving the same, a gate drive circuit and a display panel. The shift register unit circuit includes a first switch circuit configured to transmit an input signal to a first node; a second switch circuit configured to transmit a first voltage to a signal output; a third switch circuit configured to transmit a second clock signal to a second node; fourth switch circuit configured to transmit the second voltage signal to a third node; a fifth switch circuit configured to transmit a second voltage signal to the signal output; a sixth switch circuit configured to transmit the second voltage
(Continued)

signal to a fourth node; a first capacitor connected between the second clock signal and the third node; and a second capacitor connected between the first node and the second node.

14 Claims, 7 Drawing Sheets

(58) Field of Classification Search
USPC .......................................... 345/100, 213, 214
See application file for complete search history.

(56) References Cited

U.S. PATENT DOCUMENTS

| | | |
|---|---|---|
| 2009/0041177 A1 | 2/2009 | Chien et al. |
| 2015/0179277 A1* | 6/2015 | Pai ........................... G09G 3/20 377/68 |
| 2015/0187298 A1* | 7/2015 | Eom .................... G09G 3/3266 345/99 |
| 2015/0187313 A1* | 7/2015 | Lee ...................... G09G 3/3674 345/100 |
| 2015/0255034 A1* | 9/2015 | Hong .................... G09G 3/3674 345/214 |
| 2016/0035262 A1* | 2/2016 | Lee ........................ G11C 19/28 345/690 |
| 2016/0055814 A1* | 2/2016 | Yang .................... G09G 3/3677 345/213 |
| 2016/0141352 A1* | 5/2016 | Sung .................... G09G 3/3233 257/40 |
| 2016/0217728 A1* | 7/2016 | In ........................ G09G 3/3275 |
| 2016/0225341 A1 | 8/2016 | Ma et al. |
| 2016/0293090 A1 | 10/2016 | Long et al. |
| 2017/0186360 A1 | 6/2017 | Ma |
| 2017/0200419 A1 | 7/2017 | Ma |

FOREIGN PATENT DOCUMENTS

| | | |
|---|---|---|
| CN | 104835450 A | 8/2015 |
| CN | 104900189 A | 9/2015 |
| CN | 105405383 A | 3/2016 |
| CN | 106782406 A | 5/2017 |
| EP | 3217383 A1 | 9/2017 |

* cited by examiner

SHIFT REGISTER UNIT CIRCUIT, METHOD FOR DRIVING THE SAME, GATE DRIVE CIRCUIT AND DISPLAY DEVICE

CROSS-REFERENCE OF RELATED APPLICATION

The present application claims the priority of Chinese Patent Application No. 201710069661.3, filed on Feb. 8, 2017, and the entire contents thereof are incorporated herein by reference as part of the present application.

TECHNICAL FIELD

The present disclosure relates to the field of display technology, in particular, to a shift register unit circuit, a method for driving the same, a gate drive circuit and a display panel.

BACKGROUND

With the development of optical technology and semiconductor technology, flat panel displays such as liquid crystal displays (LCDs) and organic light emitting diode displays (OLEDs) have the features such as a light weight, low energy consumption, a fast response speed, good color purity and high contrast, and it is widely used in various electronic display products.

At present, the display panel mainly realizes its display function through a pixel matrix. In the working process of the display panel, a gate drive circuit converts an input signal into a scanning signal for controlling pixel to be turned on/off through some modules such as a shift register circuit, and applies the scanning signal sequentially to each row of pixels of the display panel so as to strobe each row of pixels. The number of transistors and capacitors in the existing shift register circuit is large. With the development of the flat panel display technology, the narrow frame products gradually become the favored objects of the users, and the number of transistors of the shift register circuit in the prior art will occupy a larger layout area, which is not conducive to increase the effective display area and the design with the narrow frame.

It should be noted that the information disclosed in the foregoing background section is only for enhancement of understanding the background of the present disclosure and therefore may include information that does not constitute prior art that is already known to those skilled in the art.

SUMMARY

According to the first aspect of the present disclosure, the present disclosure provides a shift register unit circuit, including:

a first switch circuit configured to be turned on in response to a first clock signal, so as to transmit an input signal to a first node, wherein: a controlling terminal of the first switch circuit receives the first clock signal, a first terminal of the first switch circuit receives the input signal, and a second terminal of the first switch circuit is connected with the first node;

a second switch circuit configured to be turned on in response to a voltage signal of the first node, so as to transmit a first voltage signal to a signal output end, wherein: a controlling terminal of the second switch circuit is connected with the first node, a first terminal of the second switch circuit receives the first voltage signal, and a second terminal of the second switch circuit is connected with the signal output end;

a third switch circuit configured to be turned on in response to the voltage signal of the first node, so as to transmit a second clock signal to a second node, wherein: a controlling terminal of the third switch circuit is connected with the first node, a first terminal of the third switch circuit receives the second clock signal, and a second terminal of the third switch circuit is connected with the second node;

a fourth switch circuit configured to be turned on in response to the voltage signal of the first node, so as to transmit a second voltage signal to a third node, wherein: a controlling terminal of the fourth switch circuit is connected with the first node, a first terminal of the fourth switch circuit receives the second voltage signal, and a second terminal of the fourth switch circuit is connected with the third node;

a fifth switch circuit configured to be turned on in response to a voltage signal of the third node, so as to transmit the second voltage signal to the signal output end, wherein: a controlling terminal of the fifth switch circuit is connected with the third node, a first terminal of the fifth switch circuit receives the second voltage signal, and a second terminal of the fifth switch circuit is connected with the signal output end;

a sixth switch circuit configured to be turned on in response to the voltage signal of the third node, so as to transmit the second voltage signal to a fourth node; wherein a logic level the fourth node is the same as that of the first node, wherein: a controlling terminal of the sixth switch circuit is connected with the third node, a first terminal of the sixth switch circuit receives the second voltage signal, and a second terminal of the sixth switch circuit is connected with the fourth node;

a first capacitor connected between the second clock signal and the third node; and a second capacitor connected between the first node and the second node.

In some exemplary embodiments of the present disclosure, the first to sixth switch circuits correspond to first to sixth transistors respectively; wherein, a controlling terminal of the first transistor receives the first clock signal, a first terminal of the first transistor receives the input signal, and a second terminal of the first transistor is connected with the first node;

a controlling terminal of the second transistor is connected with the first node, a first terminal of the second transistor receives the first voltage signal, and a second terminal of the second transistor is connected with the signal output end;

a controlling terminal of the third transistor is connected with the first node, a first terminal of the third transistor receives the second clock signal, and a second terminal of the third transistor is connected with the second node;

a controlling terminal of the fourth transistor is connected with the first node, a first terminal of the fourth transistor receives the second voltage signal, and a second terminal of the fourth transistor is connected with the third node;

a controlling terminal of the fifth transistor is connected with the third node, a first terminal of the fifth transistor receives the second voltage signal, and a second terminal of the fifth transistor is connected with the signal output end; and a controlling terminal of the sixth transistor is connected with the third node, a first terminal of the sixth transistor receives the second voltage signal, and a second terminal of the sixth transistor is connected with the fourth node.

In some exemplary embodiments of the present disclosure, the fourth node and the first node are the same node.

In some exemplary embodiments of the present disclosure, the shift register unit circuit further includes:

a seventh switch circuit configured to be turned on in response to the second clock signal, so as to communicate the first node with the fourth node.

In some exemplary embodiments of the present disclosure, the seventh switch circuit is a seventh transistor; and a controlling terminal of the seventh transistor receives the second clock signal, a first terminal of the seventh transistor is connected with the fourth node, and a second terminal of the seventh transistor is connected with the first node.

In some exemplary embodiments of the present disclosure, the transistors are P-type film transistors.

In some exemplary embodiments of the present disclosure, the first voltage signal is a low level signal and the second voltage signal is a high level signal.

In some exemplary embodiments of the present disclosure, the transistors are N-type film transistors.

In some exemplary embodiments of the present disclosure, the first voltage signal is a high level signal and the second voltage signal is a low level signal.

According the second aspect of the present disclosure, the present disclosure provides a shift register, comprising at least one shift register unit circuit, wherein one or more of the at least one shift register unit circuit is the shift register unit circuit according to any one of the above described shift register unit circuit.

In some exemplary embodiments of the present disclosure, wherein the at least one shift register unit circuit is cascaded.

According the third aspect of the present disclosure, the present disclosure provides a gate drive circuit including any one of the above described cascaded shift register unit circuits, wherein the input signal of the mth shift register unit circuit is the output signal of the (m−1)th shift register unit circuit and the output signal of the mth shift register unit circuit is the input signal of the (m+1)th shift register unit circuit, 1<m<N.

According the fourth aspect of the present disclosure, the present disclosure provides a display panel including the above gate drive circuit.

According to the fifth aspect of the present disclosure, the present disclosure provides a method for driving a shift register unit circuit, which is used to drive the shift register unit circuit provided by the above first aspect, the method includes:

controlling a first switch circuit to be turned on through a first clock signal, controlling second to fourth switch circuits to be turned off through the first clock signal and an input signal, controlling fifth to sixth switch circuits to be turned off through a second clock signal and a first capacitor; transmitting, through the first switch circuit, the input signal to a first node, and a voltage signal at a signal output end remains the same;

controlling the first switch circuit to be turned off through the first clock signal, controlling the fifth to sixth switch circuits to be turned on through the second clock signal and the first capacitor, controlling the second to fourth switch circuits to be turned off through the second clock signal, the first capacitor and a second voltage signal; transmitting, through the fifth switch circuit, the second voltage signal to the signal output end; transmitting, through the sixth switch circuit, the second voltage signal to a fourth node and storing the second voltage signal in a second capacitor; wherein the fourth node and the first node have the same logic level;

controlling the first switch circuit to be turned on through the first clock signal, controlling the second to fourth switch circuits to be turned on through the first clock signal and the input signal, controlling the fifth to sixth switch circuits to be turned off through the first clock signal, the input signal and the second voltage signal; transmitting, through the first switch circuit, the input signal to the first node and storing the input signal in the second capacitor; transmitting, through the second switch circuit, the first voltage signal to the signal output end;

controlling the first switch circuit to be turned off through the first clock signal, controlling the second to fourth switch circuits to be turned on through the second capacitor, controlling the fifth to sixth switch circuits to be turned off through the second capacitor and the second voltage signal; transmitting, through the third switch circuit, the second clock signal to the second node and controlling the voltage of the first node through the second capacitor; transmitting, through the second switch circuit, the first voltage signal to the signal output end.

In some exemplary embodiments of the present disclosure, the pulse width of the output signal of the signal output end is adjusted by adjusting the pulse width of the input signal.

It is appreciated that both the foregoing general description and the following detailed description are exemplary and explanatory only and are not restrictive of the disclosure.

BRIEF DESCRIPTION OF THE DRAWINGS

The accompanying drawings herein are incorporated in and constitute a part of this specification, illustrate embodiments consistent with the present disclosure, and together with the description serve to explain the principles of the present disclosure. Obviously, the drawings in the following description are merely some embodiments of the present disclosure, and those skilled in the art can also obtain other drawings based on these drawings without any creative work.

DETAILED DESCRIPTION

Figure 1:
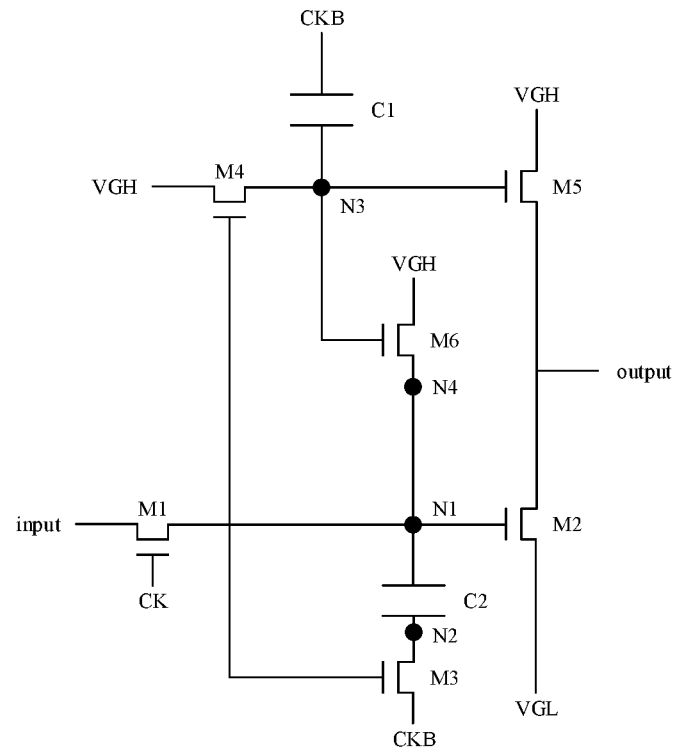
FIG. 1 schematically shows a schematic diagram of a shift register unit circuit according to an exemplary embodiment of the present disclosure.

Example embodiments will now be described more fully with reference to the accompanying drawings. However, example embodiments can be implemented in various forms and should not be construed as being limited to the examples set forth herein; rather, these embodiments are provided so that this disclosure will be more comprehensive and complete, and will fully convey the concept of the example embodiments to those skilled in the art. The features, structures, or characteristics described may be combined in any suitable manner in one or more embodiments. In the following description, numerous specific details are provided to provide a thorough understanding of the embodiments of the present disclosure. However, those skilled in the art will recognize that the technical solutions of the present disclosure may be practiced while omitting one or more of the specific details, or that other methods, components, devices, steps, and the like may be employed. In other instances, well-known technical solutions have not been shown or described in detail so as to avoid to obscure aspects of the present disclosure.

Moreover, the drawings are merely schematic illustrations of the present disclosure and are not necessarily drawn to scale. The same reference numerals in the drawings denote the same or similar parts, and their repeated description will be omitted. Some of the block diagrams shown in the figures are functional entities and do not necessarily have to correspond to physically or logically separate entities. These functional entities may be implemented in software, or implemented in one or more hardware modules or integrated circuits, or implemented in different network and/or processor devices and/or microcontroller devices.

A shift register unit circuit is provided in this exemplary embodiment. As shown in FIG. 1, the shift register unit circuit may include: a first switch circuit, a second switch circuit, a third switch circuit, a fourth switch circuit, a fifth switch circuit, a sixth switch circuit, and a first capacitor C1 and a second capacitor C2.

The first switch circuit is configured to be turned on in response to a first clock signal CK, so as to transmit an input signal, input, to a first node N1.

The second switch circuit is configured to be turned on in response to a voltage signal of the first node N1, so as to transmit a first voltage signal VGL to a signal output end, output.

The third switch circuit is configured to be turned on in response to the voltage signal of the first node N1, so as to transmit a second clock signal CKB to a second node N2.

The fourth switch circuit is configured to be turned on in response to the voltage signal of the first node N1, so as to transmit a second voltage signal VGH to a third node N3.

The fifth switch circuit is configured to be turned on in response to a voltage signal of the third node N3, so as to transmit the second voltage signal VGH to the signal output end, output.

The sixth switch circuit is configured to be turned on in response to the voltage signal of the third node N3, so as to transmit the second voltage signal VGH to a fourth node N4; wherein a logic level of the fourth node N4 is the same as that of the first node N1.

The first capacitor C1 connected between the second clock signal CKB and the third node N3.

The second capacitor C2 connected between the first node N1 and the second node N2.

It is noted that the logic level of the fourth node N4 being the same as that of the first node N1 refers to that each of the fourth node N4 and the first node N1 has a high level or a low level, but the voltages of them may not be the same.

The shift register unit circuit provided by the present exemplary embodiment includes first to sixth switch circuits and two capacitors. The number of switch circuits is small and the circuit structure is relatively simple. Therefore, the shift register unit circuit and the gate drive circuit composed of the shift register unit circuit can not only effectively reduce the area occupied by the circuit layout, thereby facilitating to design the narrow frame display panel, and at the same time, the preparation process can be simplified, thereby reducing the cost.

In consideration of the simplification of the circuit structure, as shown in FIG. 1, in the present exemplary embodiment, the fourth node N4 and the first node N1 may be the same node; that is, there is no element between the fourth node N4 and the first node N1.

Figure 2:
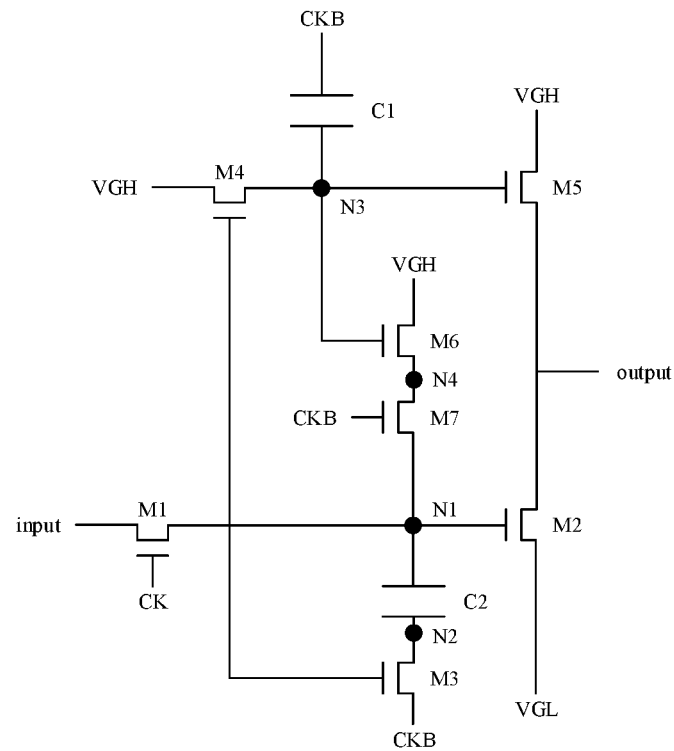
FIG. 2 schematically shows a schematic diagram of a shift register unit circuit according to another exemplary embodiment of the present disclosure.

Considering that excessive voltage may damage the sixth switch circuit, as shown in FIG. 2, in some embodiments, the fourth node N4 and the first node N1 may also be different nodes. In this case, the shift register unit circuit may further include a seventh switch circuit that may be turned on in response to the second clock signal CKB to connect the first node N1 and the fourth node N4. Here, by providing the seventh switch circuit, the sixth switch circuit can be protected.

In some embodiments, the first to seventh switch circuits may correspond to first to seventh transistors, respectively, and each transistor may have a controlling terminal, a first terminal, and a second terminal; specifically, the controlling terminal of each transistor may be a gate, its first terminal may be a source, and its second terminal may be a drain, or the controlling terminal of each transistor may be a gate, its first terminal may be a drain, and its second terminal may be a source. The exemplary embodiment does not intend to limit thereto to limit thereto. In addition, each transistor in this example embodiment may be an enhancement transistor or a depletion transistor.

The connection relationship of each transistor in the present exemplary embodiment will be described below with reference to FIG. 2.

The controlling terminal of the first transistor M1 receives the first clock signal CK, the first terminal of the first transistor M1 receives the input signal, input, and the second terminal of the first transistor M1 is connected with the first node N1.

The controlling terminal of the second transistor M2 is connected with the first node N1, the first terminal of the second transistor M2 receives the first voltage signal VGL, and the second terminal of the second transistor M2 is connected with the signal output end, output.

The controlling terminal of the third transistor M3 is connected with the first node N1, the first terminal of the third transistor M3 receives the second clock signal CKB, and the second terminal of the third transistor M3 is connected with the second node N2.

The controlling terminal of the fourth transistor M4 is connected with the first node N1, the first terminal of the fourth transistor M4 receives the second voltage signal VGH, and the second terminal of the fourth transistor M4 is connected with the third node N3.

The controlling terminal of the fifth transistor M5 is connected with the third node N3, the first terminal of the fifth transistor M5 receives the second voltage signal VGH, and the second terminal of the fifth transistor M5 is connected with the signal output end, output.

The controlling terminal of the sixth transistor M6 is connected with the third node N3, the first terminal of the sixth transistor M6 receives the second voltage signal VGH, and the second terminal of the sixth transistor M6 is connected with the fourth node N4.

The controlling terminal of the seventh transistor M7 receives the second clock signal CKB, the first terminal of the seventh transistor M7 is connected with the fourth node N4, and the second terminal of the seventh transistor M7 is connected with the first node N1.

In some embodiments, the transistors are P-type film transistors. In this case, the first voltage signal is a low level signal and the second voltage signal is a high level signal. Alternatively, in some embodiments, the transistors are N-type film transistors. In this case, the first voltage signal is a high level signal and the second voltage signal is a low level signal.

It is noted that, for different types of transistors, the signal level of each signal input and its timing status will change accordingly.

Taking the first transistor M1 to the seventh transistor M7 as P-type transistors as an example, the shift register unit circuit of the exemplary embodiment will be described with reference to FIG. 2. The first voltage signal VGL is a low level signal and the second voltage signal VGH is a high level signal.

The controlling terminal of the first transistor M1 receives the first clock signal CK, the first terminal of the first transistor M1 receives the input signal, input, the second terminal of the first transistor M1 is connected to the first node N1. When the first clock signal CK is a low level signal, the first transistor M1 is turned on, and the input signal, input, is transmitted to the first node N1 through the first transistor M1. This input signal, input, may be a low level signal or a high level signal in different periods.

The controlling terminal of the second transistor M2 is connected to the first node N1, the first terminal of the second transistor M2 receives the first voltage signal VGL, and the second terminal of the second transistor M2 is connected to the signal output end, output. When the first node N1 is at low level, the second transistor M2 is turned on, and the first voltage signal VGL is transmitted to the signal output end, output, through the second transistor M2, so as to output a low level signal.

The controlling terminal of the third transistor M3 is connected with the first node N1, the first terminal of the third transistor M3 receives the second clock signal CKB, and the second terminal of the third transistor M3 is connected with the second node N2. When the first node N1 is at low level, the third transistor M3 is turned on, and the second clock signal CKB is transmitted to the second node N2 through the third transistor M3, that is, the second terminal of the second capacitor C2.

The controlling terminal of the fourth transistor M4 is connected to the first node N1, the first terminal of the fourth transistor M4 receives the second voltage signal VGH, and the second terminal of the fourth transistor M4 is connected with the third node N3. When the first node N1 is at low level, the fourth transistor M4 is turned on, and the second voltage signal VGH is transmitted to the third node N3 through the fourth transistor M4.

The controlling terminal of the fifth transistor M5 is connected with the third node N3, the first terminal of the fifth transistor M5 receives the second voltage signal VGH, and the second terminal of the fifth transistor M5 is connected with the signal output end, output. When the third node N3 is at low level, the fifth transistor M5 is turned on, and the second voltage signal VGH is transmitted to the signal output end, output, through the fifth transistor M5, so as to output a high level signal.

The controlling terminal of the sixth transistor M6 is connected to the third node N3, the first terminal of the sixth transistor M6 receives the second voltage signal VGH, and the second terminal of the sixth transistor M6 is connected with the fourth node N4. When the third node N3 is at low level, the sixth transistor M6 is turned on, and the second voltage signal VGH is transmitted to the fourth node N4 through the sixth transistor M6.

The controlling terminal of the seventh transistor M7 receives the second clock signal CKB, the first terminal of the seventh transistor M7 is connected with the fourth node N4, and the second terminal of the seventh transistor M7 is connected with the first node N1. When the second clock signal CKB is a low level signal, the seventh transistor M7 is turned on, and the voltage signal of the fourth node N4 is transmitted to the first node N1 through the seventh transistor M7 so that the fourth node N4 is in communication with the first node N1.

The first terminal of the first capacitor C1 is connected to the second clock signal CKB, the second terminal of the first capacitor C1 is connected with the third node N3, and the second clock signal CKB is transmitted to the third node N3 through the first capacitor C1.

The first terminal of the second capacitor C2 is connected with the first node N1, the second terminal of the second capacitor C2 is connected with the second node N2, and the second capacitor C2 can be used to store the voltage of the first node N1.

The working principle of the shift register unit circuit of the exemplary embodiment will be described in detail in conjunction with the driving timing diagram in FIG. 3. In the exemplary embodiment, the phase of the first clock signal CK and the phase of the second clock signal CKB differ by a ½ signal period. The operation procedure of the shift register unit circuit may include the following stages.

Figure 3:
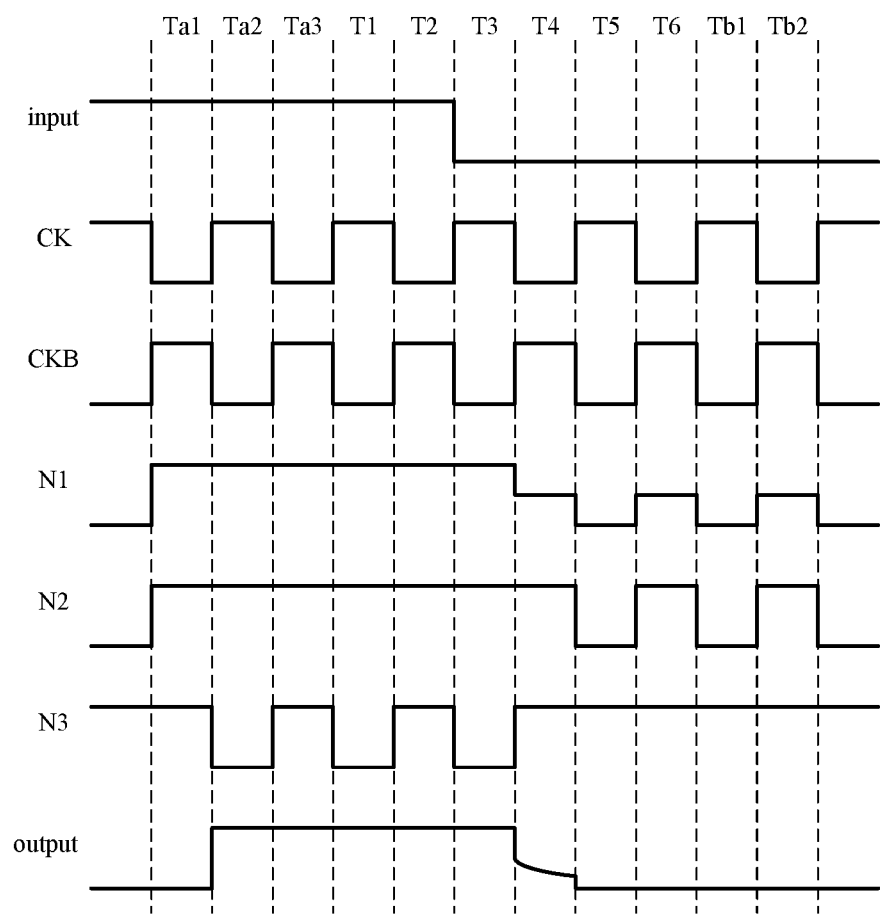
FIG. 3 schematically shows a diagram of a driving timing and a signal waveform of the shift register unit circuit in FIG. 2.
Figure 4A:
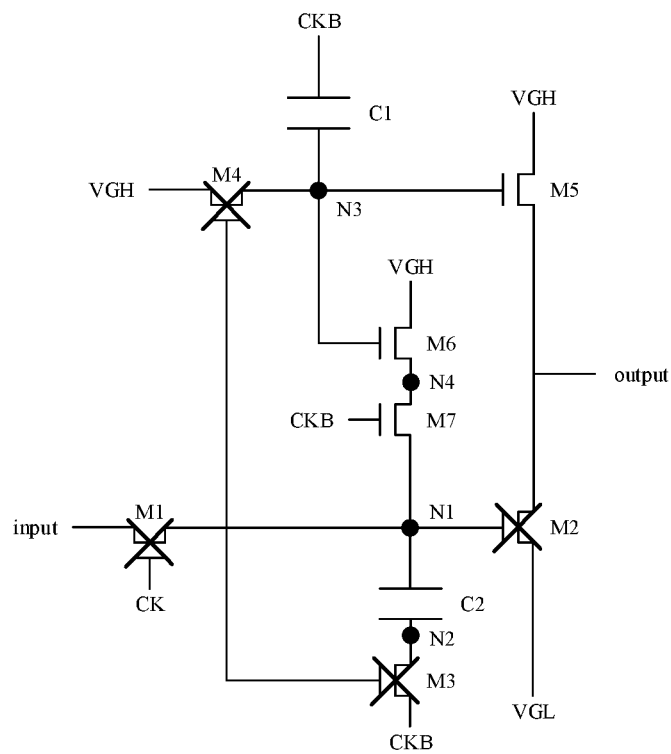
FIGS. 4A-4F schematically show equivalent circuit diagrams of the shift register unit circuit in FIG. 2 in respective periods.

The first period T1: referring to FIGS. 3 and 4A, the input signal, input, is at high level, the first clock signal CK is at high level, the first transistor M1 is turned off, and the second clock signal CKB is at low level, and the third node N3 is at low level due to the first capacitor C1. The fifth transistor M5, the sixth transistor M6 and the seventh transistor M7 are turned on; the second voltage signal VGH is transmitted to the fourth node N4 through the sixth transistor M6, and is further transmitted to the first node N1 through the seventh transistor M7, and at this time, the first node N1 is at high level; under the action of the first node N1, the second transistor M2, the third transistor M3 and the fourth transistor M4 are turned off. The second voltage signal VGH is also transmitted to the signal output end, output, through the fifth transistor M5, at this time, the signal output end, output, outputs a high level.

Figure 4B:
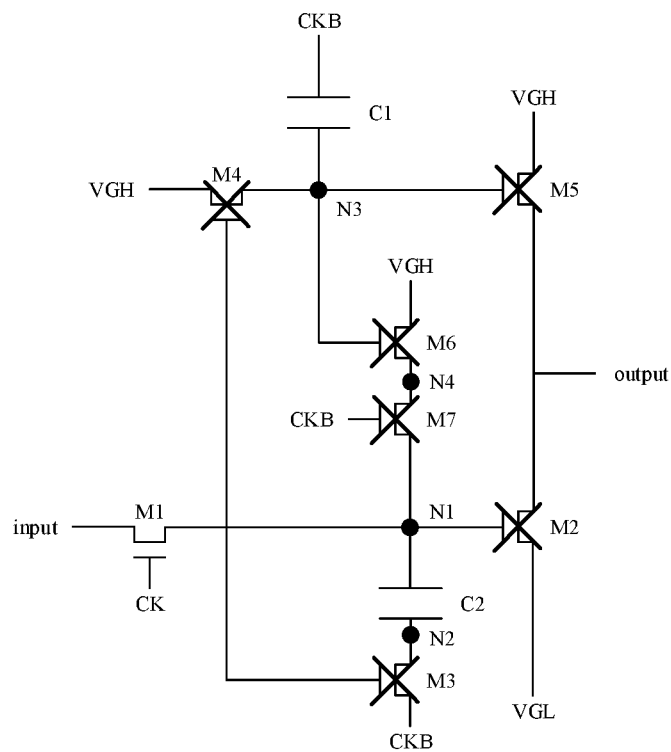

Second period T2: referring to FIGS. 3 and 4B, the input signal, input, is at high level, the first clock signal CK is at low level, the first transistor M1 is turned on and the input signal, input, is transmitted to the first node N1, the first node N1 is also at high level; under the action of the first node N1, the second transistor M2, the third transistor M3, and the fourth transistor M4 are turned off; the second clock signal CKB is at high level and the third node N3 is also at high level due to the first The capacitor C1. The fifth transistor M5, the sixth transistor M6, and the seventh transistor M7 are turned off; at this time, the potential of the signal output end, output, is maintained as the level of the previous period due to the load capacitance of the signal output end, output.

Figure 4C:
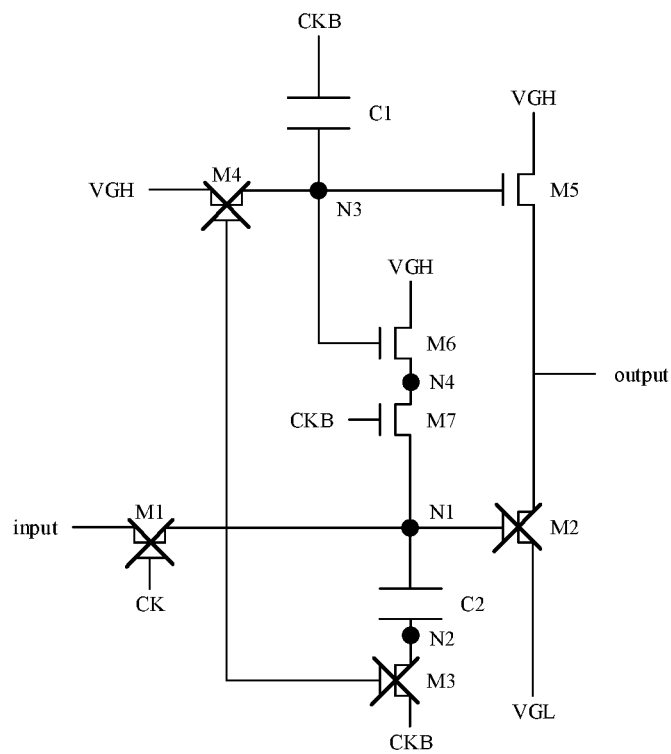

The third time period T3: referring to FIGS. 3 and 4C, the input signal, input, is at low level, the first clock signal CK is at high level, the first transistor M1 is turned off, the second clock signal CKB is at low level and the third node N3 is also at low level due to the first capacitor C1. The fifth transistor M5, the sixth transistor M6, and the seventh transistor M7 are turned on; the second voltage signal VGH is transmitted to the fourth node N4 through the sixth transistor M6, and is further transmitted to the first node N1 through the seventh transistor M7, and at this time, the first node N1 is at high level; under the action of the first node N1, the second transistor M2, the third transistor M3 and the fourth transistor M4 are turned off; the voltage signal VGH is also transmitted to the signal output end, output, through the fifth transistor M5, at this time, the signal output end, output, outputs a high level.

Figure 4D:
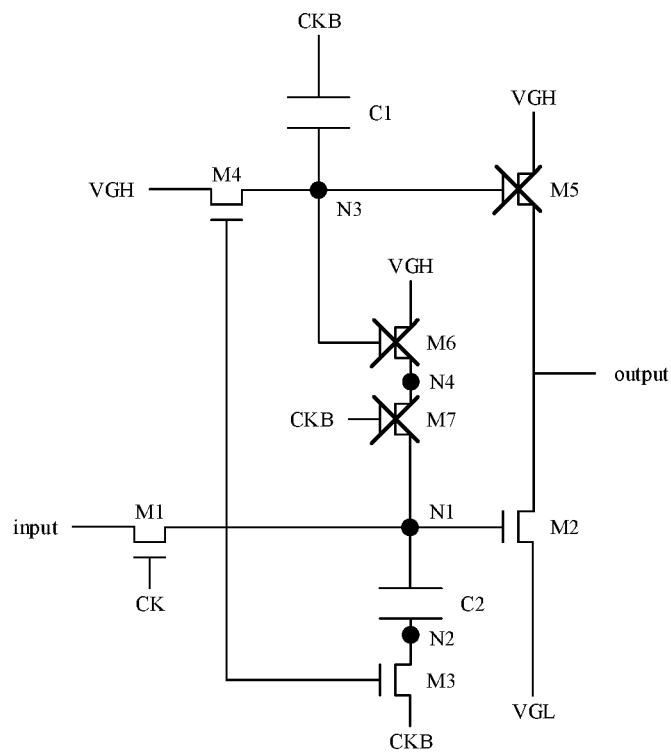

The fourth time period T4: referring to FIGS. 3 and 4D, the input signal, input, is at low level, the first clock signal CK is at low level, the first transistor M1 is turned on, and transmits the input signal, input, to the first node N1. Since the second capacitor C2 stores a high level signal in the previous period, the first node N1 is at low level; under the action of the first node N1, the second transistor M2, the third transistor M3 and the fourth transistor M4 are turned on; the first voltage signal VGL is transmitted to the signal output end, output, through the second transistor M2. At this time, the signal output end, output, outputs a low level; the second voltage signal VGH is transmitted to the third node N3 through the fourth transistor M4, so that the third node N3 is also at high level. The fifth transistor M5 and the sixth transistor M6 are turned off; the second clock signal CKB is at high level, and the seventh transistor M7 is turned off.

Figure 4E:
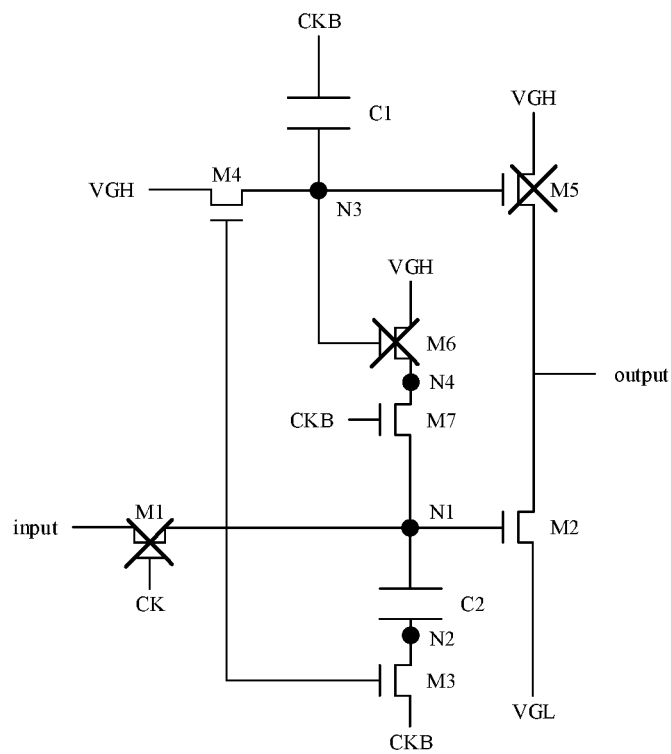

The fifth period T5: referring to FIGS. 3 and 4E, the input signal, input, is at low level, the first clock signal CK is at high level, and the first transistor M1 is turned off; since the second capacitor C2 stores a relatively low level signal in the previous period, the first node N1 is at a relatively low level; under the action of the first node N1, the second transistor M2, the third transistor M3 and the fourth transistor M4 are turned on; the second clock signal CKB is at low level, and is first transmitted to the second node N2 through the third transistor M3 and then the level of the first node N1 is dropped down through the second capacitor C2. At this time, the second transistor M2 is fully turned on and the first voltage signal VGL is fully transmitted to the signal output end, output through the second transistor M2. In this case, the signal output end, output, is at low level; the second voltage signal VGH is transmitted to the third node N3 through the fourth transistor M4, and the fifth transistor M5 and the sixth transistor M6 are turned off. The second clock signal CKB is at low level, and the seventh transistor M7 is turned on so that the fourth node N4 is in communication with the first node N1.

Figure 4F:
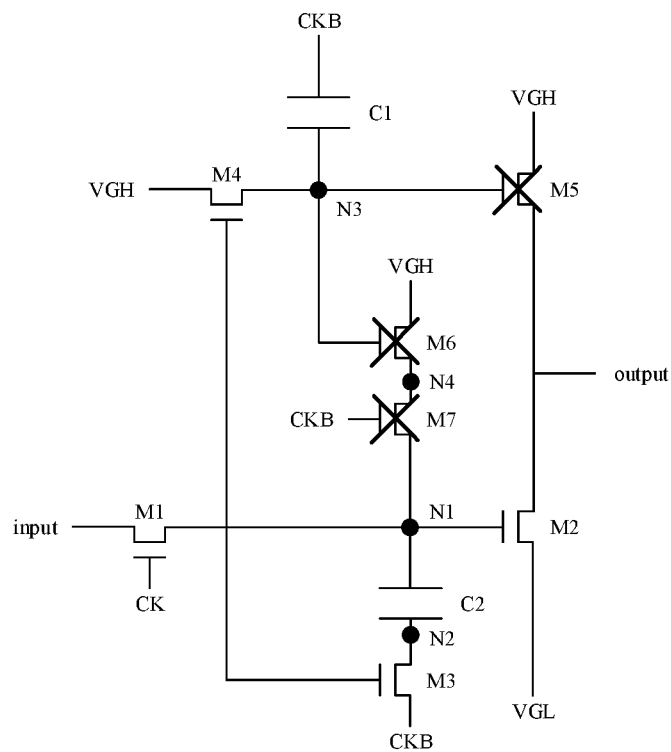

The sixth period T6: referring to FIGS. 3 and 4F, the input signal input is at low level, the first clock signal CK is at low level, the first transistor M1 is turned on and transmits the input signal, input, to the first node N1, the first node N1 is at a relatively low level; under the action of the first node N1, the second transistor M2, the third transistor M3 and the fourth transistor M4 are turned on; the first voltage signal VGL is transmitted to the signal output end, output, through the second transistor M2, at this time, the signal output end, output, is maintained to output a low level; the second voltage signal VGH is transmitted to the third node N3 through the fourth transistor M4, the third node N3 is at high level, and the fifth transistor M5 and the sixth transistor M6 are turned off; the second clock signal CKB is at high level and the seventh transistor M7 is turned off.

Based on the above description, it can be seen that the shift register unit circuit in the exemplary embodiment performs the conversion from output of a high level signal to output of a low level signal in the first period T1 to the sixth period T6, and the change of the output signal is delayed by two periods than that of the input signal. Therefore, it can be known that the purpose for adjusting the time duration when the output signal is at high level can be achieved by controlling the time duration when the input signal, input, is converted from the high level to the low level.

Based on this, with reference to the driving timing diagram shown in FIG. 3, the period when the input signal, input, is at high level may be extended before the first period T1, for example, Ta1 period to Ta3 period; and the period when the input signal, input, is at low level may be extended after the sixth period T6, for example, Tb1 period to Tb3 period. In this way, the pulse width of the output signal can be controlled by adjusting the pulse width of the input signal, input, and a shift function may be realized.

The shift register unit circuit of the exemplary embodiment employs a single-channel type transistor (that is, all transistors are the P-type thin film transistors), and has the following advantages: for example, strong noise suppression; for example, the shift register unit circuit is turned on at low level and this is easier to be realized for charging management; for example, N-type thin film transistors are susceptible to ground bounce while P-type thin film transistors are only affected by the IR Drop of the driving voltage line, and the influence of IR Drop is easier to be eliminated; for example, the manufacture process for the P-type thin film transistors is simple with a lower cost; for example, P-type thin film transistors have better stability; and so on. Therefore, the usage of P-type thin film transistors not only can reduce the complexity of the manufacture process and production costs, but also can aid to improve product quality. In addition, it is easy for those skilled in the art to make the technical solution that all the shift register unit circuits according to the exemplary embodiment adopt N-type transistors; for example, when the first transistor T1 to the ninth transistor T9 are N-type transistors, the above first voltage signal is a high level voltage, and the second voltage signal is a low level voltage; therefore, the shift register unit circuit to be protected in the present disclosure is not limited to the implementations provided by the above embodiments, and may further include some simple changes to the shift register unit circuit according to the present disclosure. Repeated description will be omitted here.

Figure 5:
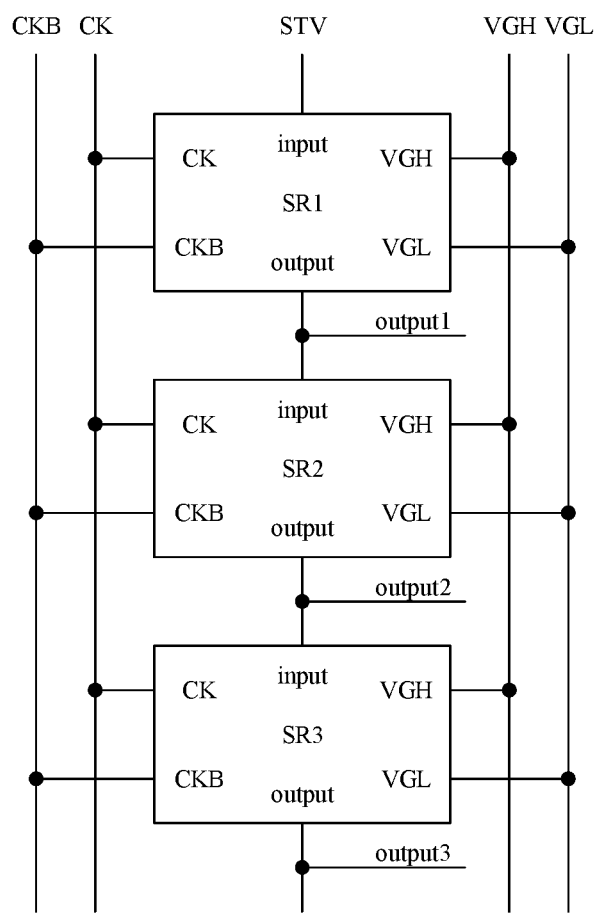
FIG. 5 schematically shows a schematic diagram of a gate drive circuit according to an exemplary embodiment of the present disclosure.

The exemplary embodiment also provides a gate drive circuit, as shown in FIG. 5, including a plurality of cascaded shift register unit circuits described above.

Specifically, the gate drive circuit may include N shift register unit circuits such as a first shift register unit circuit SR1, a second shift register unit circuit SR2, and a third shift register unit circuit SR3 (the remaining shift register unit circuits are not shown); in the exemplary embodiment, the input signal of the mth shift register unit circuit is the output signal of the (m−1)th shift register unit circuit, the output signal of the mth shift register unit circuit is the input signal of the (m+1)th shift register unit circuit, and the input signal of the first stage shift register unit circuit may be a start signal; where 1<m<N.

For example, referring to FIG. 5, the input signal of the first shift register unit circuit SR1 may be a start signal STV, and the output signal of the first shift register unit circuit SR1 may be the input signal of the second shift register unit circuit SR2. The input signal of the second shift register unit circuit SR2 may be the output signal of the first shift register unit circuit SR1, the output signal of the second shift register unit circuit SR2 may be the input signal of the third shift register unit circuit SR3, the input signal of the third shift register unit circuit SR3 may be the output signal of the second shift register unit circuit SR2, the output signal of the third shift register unit circuit SR3 may be the input signal of the fourth shift register unit circuit SR4, and so on.

Figure 6:
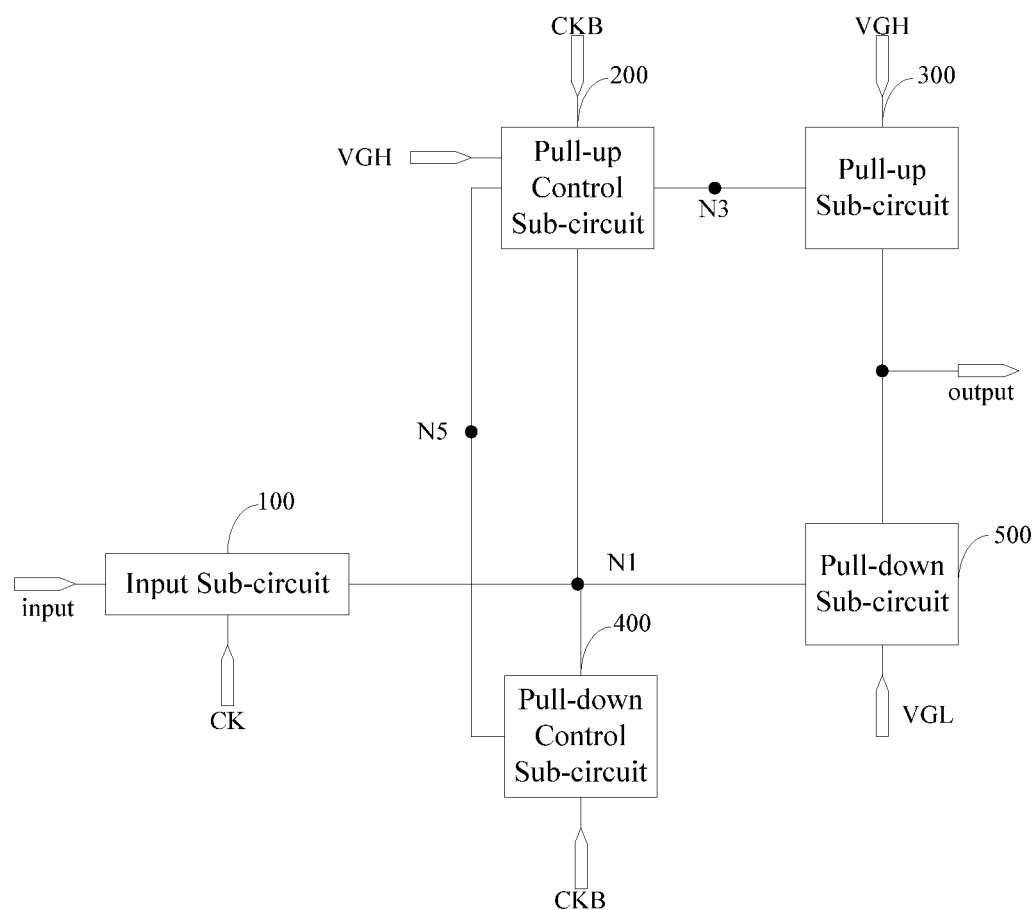
FIG. 6 schematically shows a schematic diagram of a shift register unit circuit according to another exemplary embodiment of the present disclosure.

A shift register unit circuit is provided in this exemplary embodiment. As shown in FIG. 6, the shift register unit circuit may include: an input sub-circuit 100, a pull-up control sub-circuit 200, a pull-up sub-circuit 300, a pull-down control sub-circuit 400 and a pull-down sub-circuit 500.

The input sub-circuit 100 may be coupled to a signal input terminal, a first signal terminal and a first node N1, configured to receive an input signal input from the signal input terminal and to receive a first clock signal CK from the first signal terminal, and to conduct the signal input terminal with the first node N1 under the control of the first clock signal CK.

The pull-up control sub-circuit 200 may be coupled to a second signal terminal, a third signal terminal, the first node N1, a third node N3 and a fifth node N5, configured to receive a second voltage signal VGH from the second signal terminal and to receive a second clock signal CKB from the third signal terminal, and to conduct the second signal terminal with the third node N3 under the control of a voltage signal of the first node N1.

The pull-up sub-circuit 300 may be coupled to the third node N3, a fourth signal terminal and a signal output end, configured to receive the second voltage signal VGH from the fourth signal terminal, and to conduct the fourth signal terminal with the signal output end under the control of a voltage signal of the third node N3.

The pull-down control sub-circuit 400 may be coupled to the first node N1, the fifth node N5 and a fifth signal terminal, configured to receive the second clock signal CKB from the fifth signal terminal.

The pull-down sub-circuit 500 may be coupled to the first node N1, the signal output end and a sixth signal terminal, configured to receive a first voltage signal VGL from the sixth signal terminal, and to conduct the sixth signal terminal with the signal output end under the control of the voltage signal of the first node N1.

The exemplary embodiment also provides a shift register including at least one shift register unit circuit, wherein one or more of the at least one shift register unit circuit is the shift register unit circuit according to any one of the above described shift register unit circuit.

In some exemplary embodiments of the present disclosure, wherein the at least one shift register unit circuit is cascaded.

Compared with the related art, the gate drive circuit provided by the exemplary embodiment has a simple structure and is beneficial to the design of a narrow frame display panel.

The exemplary embodiment also provides a display panel including the above-described gate drive circuit. Because the included gate drive circuit has a simple structure with a small area occupied by the layout, the effective display area of the display panel is increased, which is favorable for improving the resolution of the display panel, and at the same time, the border design of the display panel can be narrower.

Furthermore, the display panel provided by the exemplary embodiment may be a flat panel display panel such as a liquid crystal display panel, an OLED (Organic Light Emitting Diode) display panel, a PLED (Polymer Light-Emitting Diode) display panel, and a PDP (Plasma Display Panel) display panels, or the like, and there is no specific limitation to the application of the display panels.

It should be noted that the specific details of each module circuit in the display panel have been described in detail in the corresponding shift register unit circuit, and therefore will not be described here.

It should be noted that although several modules or circuits of the device for action execution are mentioned in the above detailed description, this division is not mandatory. In fact, according to embodiments of the present disclosure, the features and functions of two or more modules or circuits described above may be embodied in one module or circuit. Conversely, the features and functions of one module or circuit described above may be further divided into multiple modules or circuits.

Moreover, although various steps of the method in the present disclosure have been described in a specific order in the drawings, this does not require or imply that these steps must be performed in this specific order, or the desired results can be achieved only when all illustrated steps must be performed. Additionally or alternatively, some steps may be omitted, multiple steps may be combined into one step to execute, and/or one step may be divided into multiple steps to execute.

Based on the foregoing description of the embodiments, those skilled in the art can easily understand that the exemplary embodiments described herein may be implemented by software, and may also be implemented by software in combination with necessary hardware. Therefore, the technical solution according to the embodiments of the present disclosure can be embodied in the form of a software product that can be stored in a non-volatile storage medium, which may be a CD-ROM, U disk, mobile hard disk, or the like, or can be stored on a network, the software includes several instructions to make a computing device, which may be a personal computer, a server, a mobile terminal, a network device, or the like, perform the method according to the embodiments of the present disclosure.

The shift register unit circuit and the driving method thereof provided by the exemplary embodiments of the present disclosure include the first to sixth switch circuits and two capacitors. The circuit structure is relatively simple, the area occupied by the circuit layout can be reduced, and the display panel with the narrow frame is favorable to be designed.

The exemplary embodiment provides a shift register unit circuit, a method for driving the same, a gate drive circuit, and a display panel. The shift register unit circuit includes first to sixth switch circuits and two capacitors. The number of switch circuits is small and the circuit structure is relatively simple. Therefore, the shift register unit circuit and the gate drive circuit formed by the shift register unit circuits can not only effectively reduce the area occupied by the circuit layout, but also facilitate to design the display panel with the narrow frame, and at the same time can simplify the manufacture process, thereby reducing costs.

Those skilled in the art will readily recognize other embodiments of the present disclosure upon consideration of the specification and practice of the embodiments disclosed herein. This application is intended to cover any variations, uses, or adaptations of the present disclosure which follow the general principles of the present disclosure and include any common knowledge or customary techniques in the art not disclosed by the present disclosure. The description and examples are merely used for illustration and the true scope and spirit of the disclosure are indicated by the appended claims.

What is claimed is:

1. A shift register unit circuit, comprising:
a first switch circuit configured to be turned on in response to a first clock signal, so as to transmit an input signal to a first node, wherein: a controlling terminal of the first switch circuit receives the first clock signal, a first terminal of the first switch circuit receives the input signal, and a second terminal of the first switch circuit is connected with the first node;
a second switch circuit configured to be turned on in response to a voltage signal of the first node, so as to transmit a first voltage signal to a signal output end, wherein: a controlling terminal of the second switch circuit is connected with the first node, a first terminal of the second switch circuit receives the first voltage signal, and a second terminal of the second switch circuit is connected with the signal output end;
a third switch circuit configured to be turned on in response to the voltage signal of the first node, so as to transmit a second clock signal to a second node, wherein: a controlling terminal of the third switch circuit is connected with the first node, a first terminal of the third switch circuit receives the second clock signal, and a second terminal of the third switch circuit is connected with the second node;
a fourth switch circuit configured to be turned on in response to the voltage signal of the first node, so as to transmit a second voltage signal to a third node, wherein: a controlling terminal of the fourth switch circuit is connected with the first node, a first terminal of the fourth switch circuit receives the second voltage signal, and a second terminal of the fourth switch circuit is connected with the third node;
a fifth switch circuit configured to be turned on in response to a voltage signal of the third node, so as to transmit the second voltage signal to the signal output end, wherein: a controlling terminal of the fifth switch circuit is connected with the third node, a first terminal of the fifth switch circuit receives the second voltage signal, and a second terminal of the fifth switch circuit is connected with the signal output end;
a sixth switch circuit configured to be turned on in response to the voltage signal of the third node, so as to transmit the second voltage signal to a fourth node; wherein a logic level of the fourth node is the same as that of the first node, wherein: a controlling terminal of the sixth switch circuit is connected with the third node, a first terminal of the sixth switch circuit receives the second voltage signal, and a second terminal of the sixth switch circuit is connected with the fourth node;
a first capacitor connected between the second clock signal and the third node; and
a second capacitor connected between the first node and the second node.

2. The shift register unit circuit according to claim 1, wherein the first to sixth switch circuits correspond to first to sixth transistors respectively;
a controlling terminal of the first transistor receives the first clock signal, a first terminal of the first transistor receives the input signal, and a second terminal of the first transistor is connected with the first node;
a controlling terminal of the second transistor is connected with the first node, a first terminal of the second transistor receives the first voltage signal, and a second terminal of the second transistor is connected with the signal output end;
a controlling terminal of the third transistor is connected with the first node, a first terminal of the third transistor receives the second clock signal, and a second terminal of the third transistor is connected with the second node;
a controlling terminal of the fourth transistor is connected with the first node, a first terminal of the fourth transistor receives the second voltage signal, and a second terminal of the fourth transistor is connected with the third node;
a controlling terminal of the fifth transistor is connected with the third node, a first terminal of the fifth transistor receives the second voltage signal, and a second terminal of the fifth transistor is connected with the signal output end; and
a controlling terminal of the sixth transistor is connected with the third node, a first terminal of the sixth transistor receives the second voltage signal, and a second terminal of the sixth transistor is connected with the fourth node.

3. The shift register unit circuit according to claim 1, wherein the fourth node and the first node are the same node.

4. The shift register unit circuit according to claim 1, wherein the shift register unit circuit further comprises:
a seventh switch circuit configured to be turned on in response to the second clock signal, so as to communicate the first node with the fourth node, wherein: a controlling terminal of the seventh switch circuit receives the second clock signal, a first terminal of the seventh switch circuit is connected with the fourth node, and a second terminal of the seventh switch circuit is connected with the first node.

5. The shift register unit circuit according to claim 4, wherein the seventh switch circuit is a seventh transistor; and
a controlling terminal of the seventh transistor receives the second clock signal, a first terminal of the seventh transistor is connected with the fourth node, and a second terminal of the seventh transistor is connected with the first node.

6. The shift register unit circuit according to claim 2, wherein the transistors are P-type film transistors.

7. The shift register unit circuit according to claim 6, wherein the first voltage signal is a low level signal and the second voltage signal is a high level signal.

8. The shift register unit circuit according to claim 2, wherein the transistors are N-type film transistors.

9. The shift register unit circuit according to claim 8, wherein the first voltage signal is a high level signal and the second voltage signal is a low level signal.

10. A gate drive circuit, comprising a plurality of the cascaded shift register unit circuits according to claim 1;
wherein the input signal of the mth shift register unit circuit is the output signal of the (m−1)th shift register unit circuit and the output signal of the mth shift register unit circuit is the input signal of the (m+1)th shift register unit circuit, $1<m<N$.

11. A display panel, comprising the gate drive circuit according to claim 10.

12. A method for driving a shift register unit circuit, which is used to drive a shift register unit circuit the shift register unit circuit comprising :a first switch circuit configured to be turned on in response to a first clock signal, so as to transmit an input signal to a first node, wherein: a controlling terminal of the first switch circuit receives the first clock signal, a first terminal of the first switch circuit receives the input signal, and a second terminal of the first switch circuit is connected with the first node; a second switch circuit configured to be turned on in response to a voltage signal of the first node, so as to transmit a first voltage signal to a signal output end, wherein: a controlling terminal of the second switch circuit is connected with the first node, a first terminal of the second switch circuit receives the first voltage signal, and a second terminal of the second switch circuit is connected with the signal output end; a third switch circuit configured to be turned on in response to the voltage signal of the first node, so as to transmit a second clock signal to a second node, wherein: a controlling terminal of the third switch circuit is connected with the first node, a first terminal of the third switch circuit receives the second clock signal, and a second terminal of the third switch circuit is connected with the second node; a fourth switch circuit configured to be turned on in response to the voltage signal of the first node, so as to transmit a second voltage signal to a third node, wherein: a controlling terminal of the fourth switch circuit is connected with the first node, a first terminal of the fourth switch circuit receives the second voltage signal, and a second terminal of the fourth switch circuit is connected with the third node; a fifth switch circuit configured to be turned on in response to a voltage signal of the third node, so as to transmit the second voltage signal to the signal output end, wherein: a controlling terminal of the fifth switch circuit is connected with the third node, a first terminal of the fifth switch circuit receives the second voltage signal, and a second terminal of the fifth switch circuit is connected with the signal output end; a sixth switch circuit configured to be turned on in response to the voltage signal of the third node, so as to transmit the second voltage signal to a fourth node; wherein a logic level -of the fourth node is the same as that of the first node, wherein: a controlling terminal of the sixth switch circuit is connected with the third node, a first terminal of the sixth switch circuit receives the second voltage signal, and a second terminal of the sixth switch circuit is connected with the fourth node; a first capacitor connected between the second clock signal and the third node; and a second capacitor connected between the first node and the second node; the method comprising:
  controlling the first switch circuit to be turned on through the first clock signal, controlling the second to fourth switch circuits to be turned off through the first clock signal and the input signal, controlling the fifth to sixth switch circuits to be turned off through the second clock signal and the first capacitor; transmitting, through the first switch circuit, the input signal to the first node, and the voltage signal at the signal output end remains the same;
  controlling the first switch circuit to be turned off through the first clock signal, controlling the fifth to sixth switch circuits to be turned on through the second clock signal and the first capacitor, controlling the second to fourth switch circuits to be turned off through the second clock signal, the first capacitor and the second voltage signal; transmitting, through the fifth switch circuit, the second voltage signal to the signal output end; transmitting, through the sixth switch circuit, the second voltage signal to the fourth node and storing the second voltage signal in the second capacitor; wherein the fourth node and the first node have the same logic level;
  controlling the first switch circuit to be turned on through the first clock signal, controlling the second to fourth switch circuits to be turned on through the first clock signal and the input signal, controlling the fifth to sixth switch circuits to be turned off through the first clock signal, the input signal and the second voltage signal; transmitting, through the first switch circuit, the input signal to the first node and storing the input signal in the second capacitor; transmitting, and through the second switch circuit, the first voltage signal to the signal output end;
  controlling the first switch circuit to be turned off through the first clock signal, controlling the second to fourth switch circuits to be turned on through the second capacitor, controlling the fifth to sixth switch circuits to be turned off through the second capacitor and the second voltage signal; transmitting, through the third switch circuit, the second clock signal to the second node and controlling the voltage of the first node through the second capacitor; transmitting, through the second switch circuit, the first voltage signal to the signal output end.

13. The method according to claim 12, wherein the pulse width of the output signal of the signal output end is adjusted by adjusting the pulse width of the input signal.

14. A shift register unit circuit, comprising:
  an input sub-circuit coupled to a signal input terminal, a first signal terminal and a first node, configured to receive an input signal from the signal input terminal and to receive a first clock signal from the first signal terminal, and to conduct the signal input terminal with the first node under the control of the first clock signal;
  a pull-up control sub-circuit coupled to a second signal terminal, a third signal terminal, the first node, a third node and a fifth node, configured to receive a second voltage signal from the second signal terminal and to receive a second clock signal from the third signal terminal, and to conduct the second signal terminal with the third node under the control of a voltage signal of the first node;
  a pull-up sub-circuit coupled to the third node, a fourth signal terminal and an signal output end, configured to receive the second voltage signal from the fourth signal terminal, and to conduct the fourth signal terminal with the signal output end under the control of a voltage signal of the third node;
  a pull-down control sub-circuit coupled to the first node, the fifth node and a fifth signal terminal, configured to receive the second clock signal from the fifth signal terminal;
  a pull-down sub-circuit coupled to the first node, the signal output end and a sixth signal terminal, configured to receive a first voltage signal from the sixth signal terminal, and to conduct the sixth signal terminal with the signal output end under the control of the voltage signal of the first node.

* * * * *